(12) United States Patent
Van Hove et al.

(10) Patent No.: US 8,492,261 B2
(45) Date of Patent: Jul. 23, 2013

(54) DAMASCENE CONTACTS ON III-V CMOS DEVICES

(75) Inventors: Marleen Van Hove, Blanden (BE); Joff Derluyn, Brussel (BE)

(73) Assignee: IMEC, Leuven (BE)

( * ) Notice: Subject to any disclaimer, the term of this patent is extended or adjusted under 35 U.S.C. 154(b) by 152 days.

(21) Appl. No.: 12/689,952

(22) Filed: Jan. 19, 2010

(65) Prior Publication Data

US 2010/0176421 A1   Jul. 15, 2010

Related U.S. Application Data

(63) Continuation of application No. PCT/BE2007/000084, filed on Jul. 20, 2007.

(51) Int. Cl.
*H01L 21/28* (2006.01)
*H01L 21/3205* (2006.01)

(52) U.S. Cl.
USPC ............ 438/604; 438/590; 438/92; 438/167; 438/574; 438/683; 257/194; 257/369; 257/E21.19

(58) Field of Classification Search
USPC ................... 257/194, 369, E21.19; 438/102, 438/109, 49, 34, 590, 92, 167, 574, 683, 438/685, 604, 603
See application file for complete search history.

(56) References Cited

U.S. PATENT DOCUMENTS

| 5,484,740 A | 1/1996 | Cho |
| 5,966,597 A | 10/1999 | Wright |
| 6,271,094 B1 | 8/2001 | Boyd |
| 7,008,832 B1 * | 3/2006 | Subramanian et al. ........ 438/182 |
| 2005/0112811 A1 | 5/2005 | Hsu et al. |
| 2006/0006414 A1 * | 1/2006 | Germain et al. ............... 257/192 |
| 2006/0216930 A1 * | 9/2006 | Feng et al. ..................... 438/637 |
| 2009/0191674 A1 * | 7/2009 | Germain et al. ............... 438/172 |

FOREIGN PATENT DOCUMENTS

| JP | 2002076353 A * | 3/2002 |
| WO | WO 00/67322 | 11/2000 |
| WO | WO 2004/010507 | 1/2004 |

OTHER PUBLICATIONS

Leys et al., AlGaN HEMT grown on large size silicon substrates by MOVPE capped with in-situ deposited Si3N4; 13th Intl. Conf. on Metal Organic Vapor Phase Epitaxy, Miyazaki, Japan, May 22-26, 2006; IMEC Scientific Report 2006; Journal of Crystal Growth, available online Dec. 5, 2006.
Singer, Peter; Making the move to dual damascene processing; Semiconductor International 20; pp. 79-82, Aug. 1997.
Hayes et al., Thermal stability of TaN Schottky contact on n-GaN, Acta Materialia; vol. 51, pp. 653-663, 2003.
International Search Report & Written Opinion dated Mar. 25, 2008 for PCT/BE2007/000084.
International Preliminary Report on Patentability dated Nov. 9, 2009 for PCT/BE2007/000084.

(Continued)

*Primary Examiner* — Telly Green
(74) *Attorney, Agent, or Firm* — Knobbe Martens Olson & Bear LLP

(57) ABSTRACT

A method for manufacturing a III-V CMOS device is disclosed. The device includes a first and second main contact and a control contact. In one aspect, the method includes providing the control contact by using damascene processing. The method thus allows obtaining a control contact with a length of between about 20 nm and 5 μm and with good Schottky behavior. Using low-resistive materials such as Cu allows reducing the gate resistance thus improving the high-frequency performance of the III-V CMOS device.

19 Claims, 13 Drawing Sheets

OTHER PUBLICATIONS

Maeda et al., Systematic study of insulator deposition effect ($Si_3$,$SiO_2$, AlN, and $Al_2O_3$) on electrical properties in AlGaN/GaN heterostructures, Japanese Journal of Applied Physics, vol. 46, No. 2, pp. 547-554, Feb. 8, 2007.

Qiao et al., Low resistance ohmic contacts on AlGaN/GaN structures and the advancing Al/Ti metallization, Applied Physics Letters, vol. 74, No. 18, pp. 2652-2654, 1999.

* cited by examiner

DAMASCENE CONTACTS ON III-V CMOS DEVICES

CROSS REFERENCE TO RELATED APPLICATIONS

This application is a continuation of PCT Application No. PCT/BE2007/000084, filed Jul. 20, 2007, which is incorporated by reference hereby in its entirety.

BACKGROUND OF THE INVENTION

1. Field of the Invention

The present invention relates to a method for manufacturing contacts on III-V CMOS devices, for example field effect transistors (FETs) such as high electron mobility transistors (HEMTs).

2. Description of the Related Technology

While for semiconductor devices the needs and requirements in terms of communication, in terms of energy and/or in terms of mobility, are increasing, technologies which can handle or deliver the power required for providing higher efficiency and performance to these devices are being developed. Regarding high-power/high-efficiency requirements, performance improvements may be obtained by, for example, the use of new materials for the manufacturing of semiconductor devices. Among those materials, III-nitride materials such as GaN are of growing interest. These materials are direct wide-bandgap semiconductor materials and have initially been brought on the market for their capability to emit blue and white light. In addition to this, because of an electrical breakdown field of more than 10 times larger than that of Si, group III-nitride materials may be used for devices operating in the high-power/high-frequency field, e.g. as replacement material for Si in e.g. Lightly-Doped Drain Metal-Oxide Semiconductor (LDMOS) devices. GaN, which is one of the most popular group III-nitride materials, has shown high-power/high-temperature capabilities which enable its use in applications such as e.g. high-efficiency power conversion.

GaN-based systems may extend system performance beyond the Si intrinsic limits. GaN semiconductor material is characterized by improved electronic and transport properties with respect to Si semiconductor material. Hall mobility of higher than about 2000 cm$^2$/V.s and carrier densities of higher than about $1.2 \cdot 10^{13}$ cm$^{-2}$ have been reproducibly obtained in AlGaN/GaN heterostructures. Moreover, due to the high bandgap of the GaN semiconductor material, devices with a breakdown voltage of about 1600 V have been reported. However, the cost of this technology may be a drawback. A cost reduction can be achieved with GaN-on-Si technology. AlGaN/GaN high electron mobility transistors (HEMTs) on 150 mm Si substrates have been demonstrated (M. Leys et al., 13$^{th}$ Intl. Conf. on Metal Organic Vapor Phase Epitaxy, Miyazaki, Japan, 22-26 May 2006; IMEC Scientific Report 2006) thereby opening the possibility to combine III-V and Si processes on a same substrate. Thereby source, drain and gate contacts for III-V HEMTs are formed by metal stacks that are patterned by lift-off. The source and drain ohmic contacts are formed by alloying the metal stack at elevated temperatures. A metal which is often used in the metal stack may be Au. In the alloy process, a low barrier height metal compound, i.e. metal compound which forms a contact with low barrier height with the underlying material, is typically formed near the interface and is often combined with a highly doped region near the contact to enhance carrier tunnelling. Gate contacts, on the other hand, are formed of a Schottky metal that is at the bottom combined with an Au-based material to lower the gate resistance. Because of the low patterning yield of lift-off processes and the fast diffusion of Au in semiconductors, current III-V technology is not compatible with state-of-the-art CMOS Si technology.

To achieve a high transconductance and a high saturation current in a semiconductor device, e.g. CMOS device, high quality ohmic contacts with a contact resistance less than 1 Ω.mm are advantageous. A gate with low leakage current, i.e. below about 10$^{-8}$ mA/mm, low resistivity and good adhesion increases the performance and reliability of the device. For power HEMTs a Schottky gate contact with large barrier height helps to achieve low gate leakage currents, high breakdown voltages and high turn-on voltages. The gate resistance may limit the output power gain and maximum oscillation frequency of the device. The high frequency (HF) performance is better for smaller gate resistances. The gate resistance can be changed by changing the gate structure and the resistance of the gate material. Typical values for the gate resistance are about 50-100 Ω/mm for gate lengths of 1-2 µm.

Scaling down of semiconductor devices has as a consequence scaling down of the gates. Smaller gates lead to higher gate resistance when using the same materials. Therefore high performance of smaller devices depends even more on the quality and resistance of the metallic contacts formed. Furthermore, patterning and reliability of these smaller gates is more difficult.

SUMMARY OF CERTAIN INVENTIVE ASPECTS

Certain inventive aspects relate to a method for manufacturing a III-V CMOS device.

An advantage of the method according to embodiments of the invention is that III-V CMOS devices with good properties may be obtained without the requirement of using expensive materials like Au or of using techniques such as lift-off techniques. It is an advantage of embodiments of the present invention that the III-V semiconductor processing is made compatible with Si processing.

By using a method according to embodiments of the invention, III-V CMOS devices with contacts having narrow features can be obtained. For example, control contacts with a length of between about 20 nm and 5 µm, particularly between about 50 nm and 2 µm, can be obtained.

In a first aspect of the invention, a method is provided for manufacturing contacts on a III-V CMOS device. The method comprises at least providing a control contact, wherein providing the control contact is performed by using damascene processing.

One inventive aspect allows making a control contact, for example a gate contact, with small lengths, low leakage, low resistance, good adhesion and sufficiently high temperature stability.

According to embodiments of the invention, providing a control contact may be performed such that the control contact forms a Schottky contact. The control contact may form a Schottky contact with high Schottky barrier height, typically in the range of between about 0.6 eV and 0.9 eV.

According to embodiments of the invention, the method may furthermore comprise providing a first and second main contact. Providing a first and second main contact may be performed such that the first and second main contacts form ohmic contacts. Embodiments of the present invention for example allow making first and second main contacts, for example source and drain contacts, with low contact resistance in the range of between about 0.5 Ω.mm and 1 Ω.mm and thus forming good ohmic contacts.

Providing a first and second main contact may be performed by using damascene processing.

Providing a control contact may be performed such that it has a T-shaped form.

According to embodiments of the invention, providing a T-shaped control contact may be performed by using dual damascene processing. According to other embodiments of the invention, providing a T-shaped control contact may be performed by repeating process steps of a single damascene process.

Providing the control contact may be performed by:
depositing a dielectric stack,
providing at least one hole in the dielectric stack, and
filling the at least one hole with a conductive material.

Filling the at least one hole with a conductive material may comprise:
depositing a layer of conductive material, and
removing excess conductive material outside the at least one hole.

Removing excess conductive material may be performed by chemical mechanical polishing.

According to embodiments of the invention, the method may furthermore comprise, before depositing a layer of conductive material, depositing a barrier layer. The barrier layer may be for preventing diffusion of conductive material in underlying layers, improving adhesion of the conductive material on the dielectric stack and/or improving filling of the at least one hole with a conductive material.

According to embodiments of the invention, the barrier layer may comprise one or more materials selected from the group comprising Ti and TiN and the conductive material may comprise Al.

According to other embodiments of the invention, the barrier layer may comprise one or more materials selected from the group comprising Ta and TaN and the conductive material may comprise Cu.

The method may furthermore comprise, before providing at least one hole, planarizing the dielectric stack.

Planarizing the dielectric stack may be performed by chemical mechanical polishing.

The dielectric stack may comprise at least one material selected from the group of SiN, $SiO_2$, and SiC.

The method may furthermore comprise, before depositing a layer of conductive material, performing a cleaning process.

The cleaning process may comprise:
degassing at a temperature between about 300° C. and 500° C., and
cleaning the at least one hole with an Ar plasma or $H_2/N_2$ reactive pre-clean.

One inventive aspect relates to the use of the method for manufacturing a high electron mobility transistor wherein the control contact forms a gate contact.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1A:
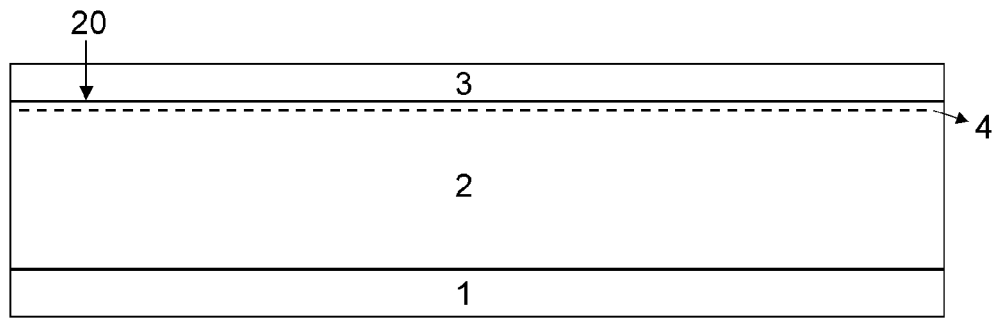
FIGS. 1(a) to 1(i) show subsequent processes for the formation of damascene ohmic source and drain contacts and a damascene Schottky gate contact on an AlGaN—GaN HEMT device, including the fabrication of a T-gate using single damascene processing according to embodiments of the present invention.

In the different figures, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the preferred embodiments, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Certain embodiments relate to a method for manufacturing contacts on a III-V CMOS device. The method comprises at least providing a control contact, wherein providing the control contact is performed by using damascene processing.

According to embodiments of the invention, the method may furthermore comprise providing a first and second main contact. The first and second main contact may, according to embodiments of the invention, be formed by damascene processing.

Embodiments of the present invention for example allow making first and second main contacts, for example source and drain contacts, with low contact resistance in the range of between about 0.5 Ω.mm and 1 Ω.mm and thus forming good ohmic contacts, and a control contact, for example a gate contact, with small lengths, low leakage, low resistance, good adhesion and sufficient high temperature stability. The control contact forms a Schottky contact with high Schottky barrier height, typically in the range of between about 0.6 eV and 0.9 eV. The method according to embodiments of the present invention uses damascene technology for making at least the control contact, e.g. gate contact. According to embodiments of the invention, also a first main contact, e.g. source contact, and a second main contact, e.g. drain contact, can be formed by using damascene technology. The first and second main contacts may be ohmic contacts.

In damascene technology trenches or holes are etched in a dielectric and are subsequently filled with a conductive material, e.g. metal. Next, the conductive material on the regions surrounding the trenches or holes is removed, by, e.g., chemical mechanical polishing (CMP). Details of the damascene process are described in "Making the move to dual damascene processing" by P. Singer in Semiconductor International 20, 79-82, 1997. An advantage of using damascene technology, e.g. single damascene or dual damascene technology, is that there is a lot of experience with patterning of small trenches, filling of small trenches, and yield optimization. To be compatible with Si submicron stepper lithography processes, avoiding the need for slow and expensive electron-beam lithography typically used for III-V processing, the substrates need to be planarized by CMP (chemical mechanical polishing) before each lithographic process. Al and Cu damascene processes are developed to be compatible with small interconnect line widths of the Si roadmap. Moreover, after etching trenches for forming the control contact, e.g. gate contact, the use of a second lithographic process to etch the material the control contact is formed of can be avoided by the use of such damascene processes. Furthermore, by using the damascene process for forming the control contact, contacts with narrow features can be obtained. For example, control contacts with a length of between about 20 nm and 5 µm, particularly between about 50 nm and 2 µm, can be obtained.

For RF applications a control contact, e.g. gate contact, with low contact resistance may be advantageous. In prior art III-V processing, Au-based lift-off gate processes are being used. These processes are not compatible with Si technology. Cu damascene processes on the other hand are compatible with Si technology. Moreover, the resistance of Cu is ~30% lower than that of Au and even 60% lower than that of Ni/Au, which is the most common metal combination used to form gate contacts on e.g. AlGaN/GaN high electron mobility transistors (HEMTs). Hence, an advantage of the method according to embodiments of the invention is that III-V CMOS devices with good properties as described above may be obtained without the requirement of using materials like Au or of using techniques such as lift-off techniques. By doing this, the III-V process is made compatible with Si processing.

By using a dual damascene process or by repeating a single damascene process, a "T-shaped gate" can be formed. Such "T-gates" allow further reducing the resistance of the control contact by providing a field plate, also referred to as top plate, on top of the control contact to lower the peak electrical field at edges of the control contact.

As damascene processing as known by a person skilled in the art is optimized for plug and/or trench filling in Si technology, the materials suitable for being used with this damascene processing may not realize a Schottky contact between the conductive material, e.g. metal, of the control contact, e.g. gate contact, and an underlying III-V material, e.g. in an HEMT structure. Also adhesion problems between the metallic damascene barrier and the grown III-V material might occur and, furthermore, diffusion of the gate metal into the III-V material needs to be avoided. Optimization of lithographic processes used may be necessary, as well as fine-tuning of etch, strip and cleaning plasmas.

The method according to embodiments of the present invention will be described by means of a method for manufacturing a III-V High Electron Mobility Transistor (HEMT) having a source and drain contact and a gate contact. It has to be understood that this is only for the ease of explanation and is not intended to limit the invention in any way. The method according to embodiments of the invention can be used to form any other III-V CMOS device such as, for example, a III-V Metal-Semiconductor Field Effect Transistor (MESFET) or any other FET. The method according to embodiments of the invention may also be used to form Si-based III-V CMOS devices.

Layers of material used to form a HEMT, also referred to as HEMT layers, can be fabricated by molecular beam epitaxy (MBE) or by metal-organic chemical vapor deposition (MOCVD), in which the device layers are built up by deposition of molecules in a vacuum. A conventional HEMT, e.g. an AlGaAs/GaAs HEMT, uses an undoped relatively low-bandgap material for the channel (for example GaAs), which is supplied with electrons by a relatively higher bandgap (for example AlGaAs) doping layer between the channel and the gate contact. By combining materials with different bandgaps, i.e. a material with a higher bandgap and a material with a lower bandgap, a quantum well may be formed at the interface between the combined materials. The separation of the channel dopant layer, where electron scattering is high, from the channel itself significantly increases the mobility of the electrons in the channel. It is the high mobility of the carriers that provides the fundamental advantage of HEMT technology over conventional MESFET devices in high frequency operation. In the more particular case of an AlGaN/GaN HEMT, the higher bandgap material, in the example given AlGaN, is undoped and a high sheet carrier concentration in the quantum channel is obtained by piezoelectric and spontaneous polarization induced effects. The HEMT growth typically starts with a buffer layer to achieve a high quality device. In case the substrate material is different from the active material, this buffer layer also accommodates the difference in lattice constant. Related devices are included as well in the embodiments described herein.

Subsequent processes for making a III-V HEMT device according to different embodiments of the invention are illustrated in FIGS. 1 to 3. FIG. 1 illustrates the case where all contacts, i.e. source, drain and gate contacts, of the III-V HEMT device are formed by using damascene technology. FIGS. 2 and 3 illustrate cases where the gate contact of the III-V HEMT device is formed by using damascene technology and where the source and drain contacts of the III-V HEMT device are formed by using conventional etching techniques.

According to a first embodiment, subsequent processes of a method for forming a III-V HEMT device using damascene processing for the first and second main contact and for the gate contact will be described by means of FIGS. 1(a) to 1(i).

In a first process, different HEMT III-V layers are provided (see FIG. 1(a)) on a substrate 1. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or an $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer.

Provision of the HEMT III-V layers can be done by epitaxial techniques as known by a person skilled in the art. On the substrate 1 extra buffer layers such as e.g. AlN nucleation and AlGaN interlayers (not shown in the figures) may be grown. Next, a first active layer 2, also referred to as buffer layer, and a second active layer 3 with a higher bandgap than the first active layer 2 are deposited. In case of the present example where the III-V device is a HEMT, a two-dimensional-electron-gas layer (2DEG layer) 4 is created near an interface 20 between the first and the second active layer 2, 3. This is because of the bandgap discontinuity at the interface 20 between the first and second active layer 2, 3. It may be noted that in case the III-V CMOS device is a MESFET, an active region may be formed by a single doped layer.

The first active layer 2 may, for example, comprise GaN, GaAs or InGaAs. The thickness of the first active layer 2 may, for example, be between about 500 nm and 5 μm, particularly between about 700 nm and 3 μm and more particularly better between about 1 μm and 2 μm. The second active layer 3 may, for example, comprise AlGaN, AlGaAs or InAlAs. The thickness of the second active layer 3 may, for example, be between about 5 and 100 nm, particularly between about 10 nm and 50 nm and more particularly between about 20 and 30 nm. An example of a structure as illustrated in FIG. 1(a) may be an AlGaN/GaN heterostructure grown on a Si(111) substrate 1. Optionally, as already described above, extra buffer layers, e.g. nucleation layers and/or interlayers such as e.g. AlGaN, AlN or GaN interlayers, may be provided to overcome the thermal expansion and lattice mismatch between the substrate and the first active layer 2 of the heterostructure. According to embodiments of the invention, AlGaN can have an Al concentration between about 15 and 40%, particularly between about 20 and 30%. The HEMT layers can be deposited by metalorganic chemical vapor deposition (MOCVD), by molecular beam epitaxy (MBE) or by any other suitable method known by a person skilled in the art. Other materials that can be used for making the heterostructure as illustrated in FIG. 1(a) may, for example, be AlGaAs/GaAs on a GaAs substrate, AlGaAs/InGaAs on a GaAs substrate, InAlAs/InGaAs on a InP substrate, . . . .

Figure 1B:
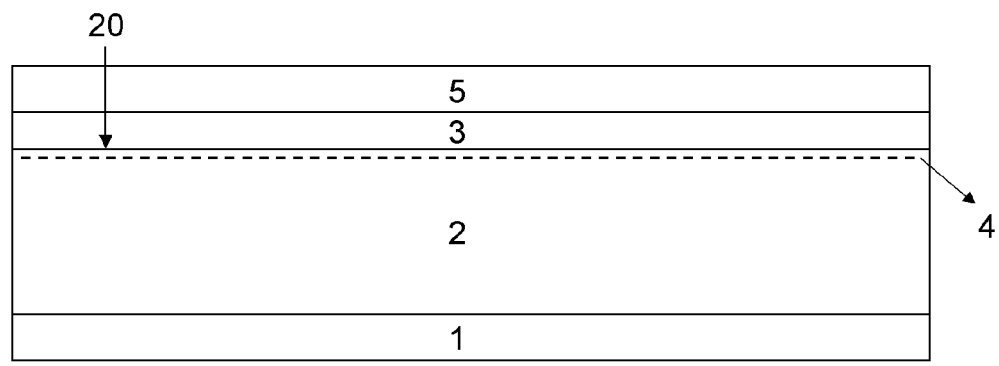

In a next process, a first passivation layer 5, also referred to as first dielectric layer 5, may be deposited onto the second active layer 3 (see FIG. 1(b)). This first passivation layer 5 may protect the second active layer 3 during subsequent processes such as dry etching and damascene polishing processes. The first passivation layer 5 may also influence the 2DEG layer 4 and/or surface states present at a surface of the second active layer 3, especially if the first passivation layer 5 is formed by a thin in-situ passivation layer with a thickness of, for example, between about 1 and 20 nm. This is described in "Systematic study of insulator deposition effect on electrical properties in AlGaN/GaN heterostructures" by N. Maeda et al. in Jap. Journal of Appl. Phys. 46, nr. 2, 547-554, 2007. According to embodiments of the invention, this passivation layer 5 may be omitted. Processing in that case is represented in FIG. 3. If present, the first passivation layer 5 may, for example, comprise SiN, $SiO_2$, AlN, $Al_2O_3$, SiC, SiCN, SiOC, $Ta_2O_5$, $HfO_2$, $ZrO_2$, . . . . In fact any kind of low-k or high-k material or a combination thereof can be used to form the first passivation layer 5. The first passivation layer 5 may be deposited in-situ in the same equipment as the HEMT layers, or can be a combination of at least one in-situ deposited layer and at least one ex-situ deposited layer. The in-situ and ex-situ deposited passivation layers 5 can have the same composition or can have a different composition. The thickness of this first passivation layer 5 may, for example, be between about 1 nm and 500 nm, between about 10 nm and 300 nm, between about 20 nm and 200 nm, between about 1 nm and 20 nm, between about 2 nm and 10 nm or between about 3 nm and 5 nm. The first passivation layer 5 can be a combination of at least one thin in-situ layer with a thickness between about 1 nm and 50 nm, particularly between about 2 and 20 nm, and at least one ex-situ layer with a thickness between about 50 nm and 500 nm.

In a next process, source and drain contacts are formed on the HEMT structure. Examples of suitable metal stacks that can be used to form source and drain contacts are Ti/Al/Mo/Au, Ti/Al/Pt/Au, Ti/Al/Ni/Au, Ti/Al, Ti/Ta/Al, Ti/Al/TiW, Ti/Al/TiN, Ti/Al/Wsi. Other examples may be Ta/Al/M, TaN/Al/M, Ta/Si/M, TaN/Si/M whereby M can be another metal stack. The function of the metal stack M can be to prevent oxidation of the underlying materials and/or to lower the contact resistance of source and drain contacts. M can, for example, be Pt/Au, NiAu, Mb/Au, TaN/Cu. However, Au has the disadvantage that it is not compatible with Si processing.

According to the present embodiment, source and drain contacts may be formed by damascene processing.

Figure 1C:
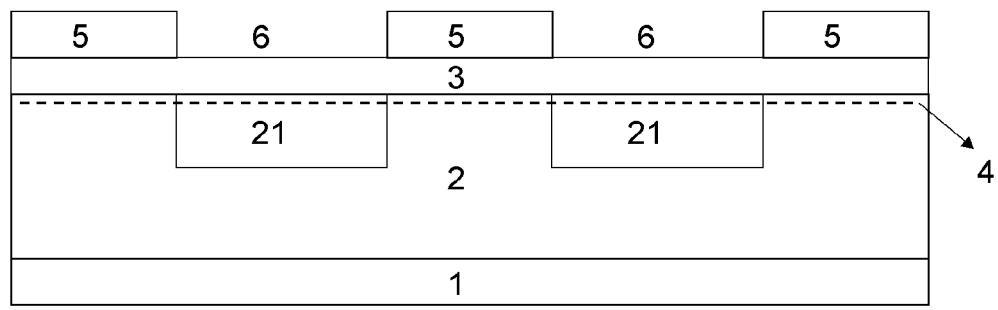
Figure 1D:
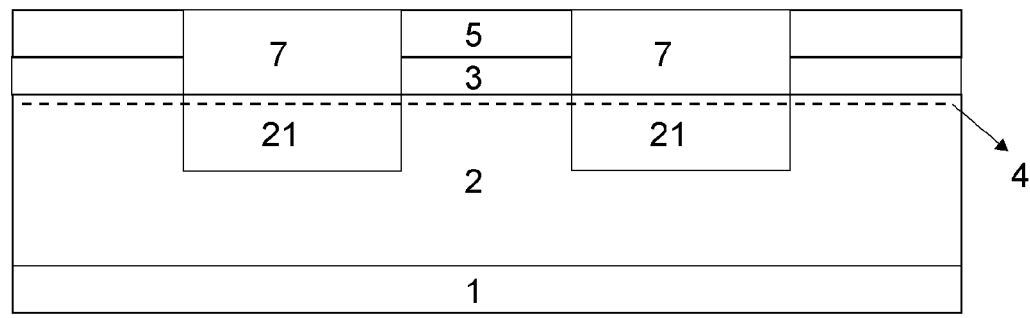

In the present example, source and drain contacts can be formed on the second active layer 3 through holes or trenches 6 formed in the passivation layer 5 (see FIG. 1(c)). The trenches 6 may first be defined in the passivation layer 5 by, for example, lithography. The trenches 6 are then formed by subsequently etching the passivation layer 5. According to embodiments of the invention, etching may be stopped in the passivation layer 5, or in other words, only part of the depth of the passivation layer 5 towards the substrate 1 may be etched away. In this case a part of the passivation layer 5 remains at the bottom of the trenches 6. According to other embodiments, and as illustrated in FIG. 1(c), the trenches 6 can be etched fully through the passivation layer 5 thereby stopping on the second active layer 3. According to still other embodiments of the invention, the trenches 6 may be etched through the passivation layer 5 and partly through the second active layer 3.

In a next process, implantation of dopant elements, for example of Si, may be performed for forming doped regions 21 in the first active layer 2 (see FIG. 1(c)). In this process, the remaining parts of the passivation layer 5 may be used as a mask for protecting underlying parts of the heterostructure outside the regions to be implanted from being exposed to the dopant elements. In the example given, implantation of the dopant elements may be done through the second active layer 3. The process of implantation of dopant elements may be optional, but may help to realize better ohmic source and drain contacts. Activation of the implant might be done by a high temperature anneal process, e.g. at temperatures higher than 600° C.

Next, source and drain contacts 7 are formed by depositing a metal stack, which may for example comprise Ti/Al, Ti/Ta/Al, Ta/Ti/Al, . . . , on the obtained topography and in the holes 6. After deposition, the metal stack may be planarized by, for example, CMP. Subsequently the metal stack may be alloyed at a temperature of between 800 and 900° C. through which reaction takes place between the metal stacks of the source and drain contacts 7 and the second active layer 3. That way the source and drain contacts 7 are extended to reach the first active layer 2 as can be seen from FIG. 1(d).

In a next process, the gate contact may be formed. According to the present embodiment, this may be done by damascene technology. As already discussed before, the method according to embodiments of the present invention is compatible with Si technology and therefore this process can, for example, be done in a Si CMOS process line.

Figure 1E:
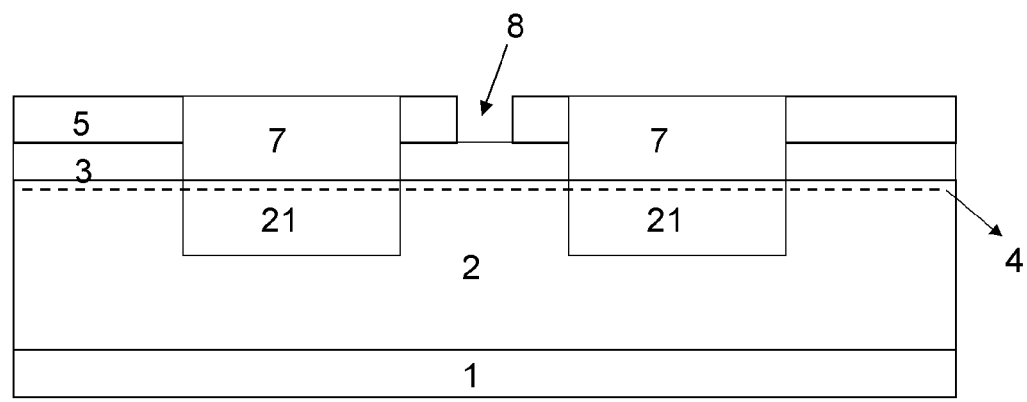
Figure 1F:
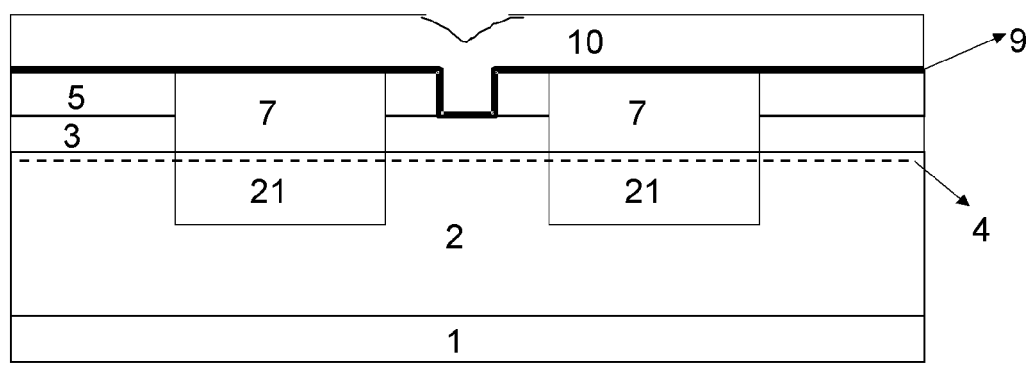

In a next process trenches 8 are formed, e.g. etched, in the passivation layer 5 at locations where the gate contacts are to be formed (see FIG. 1(e)). These trenches 8 may also be referred to as gate trenches 8. The gate trenches 8 may be defined by means of, for example, lithography. This may be followed by etching of the trenches 8 and, in case lithography was used to define the trenches 8, removal of a resist used in the lithography process. Etching can be done by dry and/or wet etching. According to embodiments of the invention and as illustrated in FIG. 1(e), the gate trenches 8 may be etched completely through the first passivation layer 5 down to and stopping on the underlying second active layer 3. However, according to embodiments of the present invention, the gate trenches 8 may only be etched partly through the first passivation layer 5, thereby stopping at a predetermined height in the passivation layer 5 before the second active layer 3 is reached.

The gate trenches 8 may have a length between about 20 nm and 5 µm, particularly between about 50 nm and 2 µm. Consequently, the length of the gate contacts, later formed, may be between about 20 nm and 5 µm, particularly between about 50 nm and 2 µm. The width of the trenches 8 may be between about 1 µm and 5 mm, between about 2 µm and 1000 µm, between about 5 µm and 500 µm or between about 10 µm and 200 µm. The depth of the trenches 8 can vary between about 10 nm and 500 nm. According to embodiments of the invention, also fingered gates with several connected gate parts can be used to form gate contacts. The aspect ratio of the gate trenches 8 may be defined as the depth of the trenches 8 divided by the length of the trenches 8. The aspect ratio can vary between 1/500 and 25 and is particularly higher than 2.

Before filling the trenches 8 with conductive material to form the gate contact, cleaning of the trenches 8 can optionally be performed. This can be done by degassing at temperatures between about 300° C. and 600° C., particularly between about 350° C. and 550° C. and more particularly between about 350° C. and 400° C., and/or a pre-clean using an Ar gas/plasma or a $H_2$/He reactive pre-clean at room temperature. Then, as in the example illustrated in FIG. 1(f), first a barrier layer 9 may be deposited before a layer 10 of conductive material is deposited to fill the gate trench 8. The barrier layer 9 may prevent diffusion of the conductive material 10 towards the underlying HEMT structure, thereby improving the reliability of the device. The barrier layer 9 may also improve the adhesion of the conductive material 10 to the material of, in the example given, the second active layer 3. Furthermore, the barrier layer 9 may facilitate filling of the trenches 8 with the conductive material 10. Examples of suitable materials to be used for the barrier layer 9 may be Ta, TaN, Ti, TiN, WN, WNC, WSiN, Ru, Os, Mg, ... or combinations thereof. Two or more different layers of materials may be used to form the barrier layer 9. Examples of suitable combinations may be Ti/TiN, TaN/Ta, Ta/TaN, .... The thickness of the barrier layer 9 may be between about 5 nm and 50 nm, between about 10 nm and 40 nm, between about 20 and 30 nm. In case the barrier layer 9 consists of two different layers, the thickness of each layer can vary between about 2 nm and 48 nm, between about 3 nm and 40 nm, between about 5 nm and 20 nm or between about 10 nm and 15 nm. Filling of the trenches 8 can be done with only one conductive material 10 or with a combination of different conductive materials or layers of conductive material. The choice of the materials to fill the gate trenches 8 with determines the quality of the Schottky gate contact to be formed, i.e. determines the Schottky barrier height of the gate contact. The choice of conductive material also determines the filling of the trenches 8, the gate resistance, the reliability, the adhesion and the diffusion of the conductive material towards the HEMT structure. The gate resistance determines the high frequency and switching behavior of the HEMT device. The lower the conductivity of the material and hence the gate resistance, the faster the switching frequency of the HEMT device will be. Also the aspect ratio of the gate trench 8 can influence the gate resistance, i.e. the higher the aspect ratio is, the lower the gate resistance may be. Conductive materials that can be used to fill the trenches 8 may, for example, be Cu, Au, Al, Pt. These materials can be deposited by, for example, electroplating, PVD (physical vapor deposition), ALD (atomic layer deposition) or any other method known in the art. The thickness of these layers depends on the size (i.e. width and depth) of the gate trenches 8 that need to be filled. The thickness of the layer 10 of conductive material can vary between about 100 nm and 1500 nm, particularly between about 200 nm and 1000 nm, more particularly between about 400 nm and 800 nm or between about 500 nm and 700 nm. In cases where the conductive material 10 forms a Schottky barrier with no in-diffusion, sufficient adhesion and good reliability, the barrier layer 9 may be omitted. According to embodiments of the invention, in between the barrier layer 9 and the conductive material 10 a seed material, e.g. low-resistivity seed metal such as Cu, may be deposited. After deposition of the conductive material 10, in the best case the gate trenches 8 may be filled completely. Some material can come out of the trenches 8. Also some material can be deposited in regions outside the trenches 8. The excess conductive material 10 can be removed during further processing. Examples of combinations of a barrier layer 9 and a conductive material 10 suitable to be used according to embodiments of the invention may be a barrier layer 9 comprising Ti and/or TiN and a conductive material comprising Al, or a barrier layer 9 comprising Ta and/or TaN and a conductive material comprising Cu.

According to embodiments of the invention, extra treatments may be performed prior to deposition of the barrier layer 9 and/or the layer 10 of conductive material to improve adhesion of the conductive material 10 to the underlying material of the HEMT structure and/or filling of the gate trenches 8. Examples of such treatments may be high temperature treatments for degassing or plasma cleaning treatments. Furthermore extra layers, possibly on top of the barrier layer 9, may be used to facilitate filling of the gate trenches 8 with conductive material. An example of such extra layers may be a low-resistive Cu seed layer deposited with PVD prior to filling the trenches 8 with electro-chemical deposition of Cu.

Figure 1G:
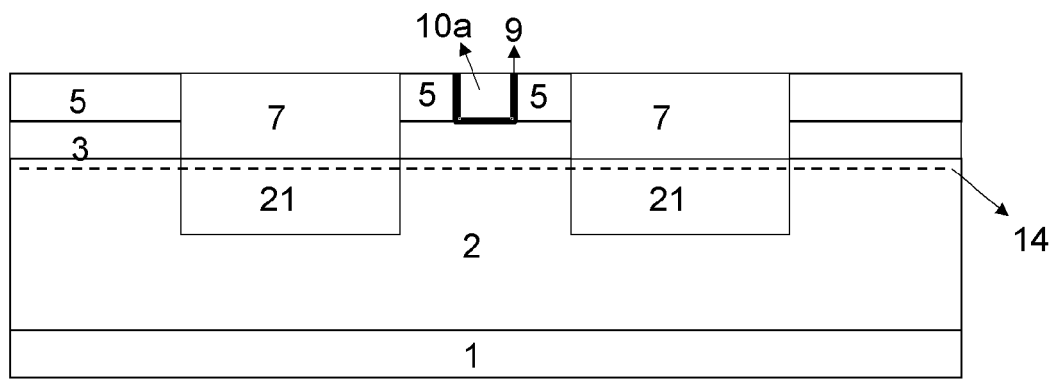
Figure 1H:
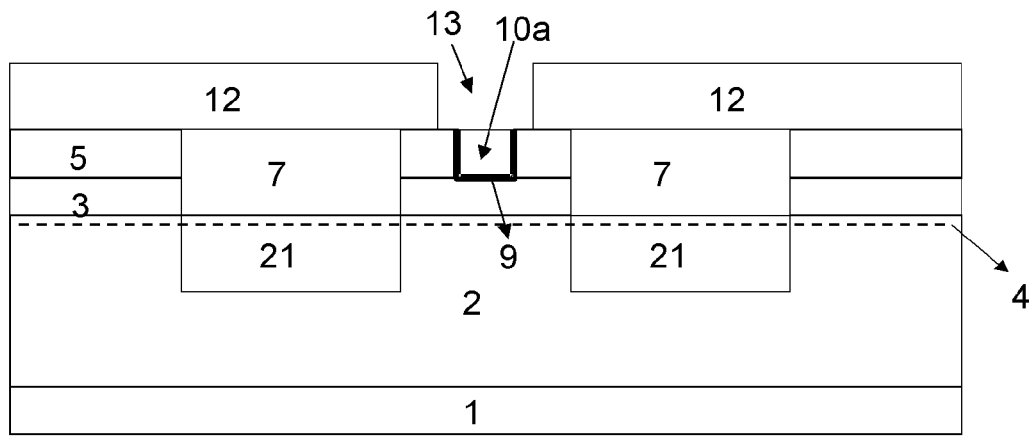
Figure 1I:
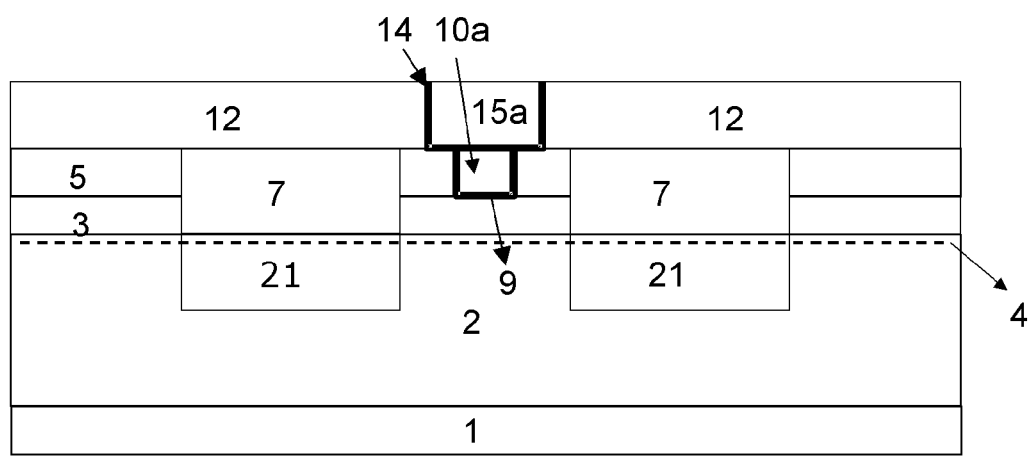

In a further process, the excess of conductive material 10 on top of the structure can be removed by CMP (see FIG. 1(g)). Also dry or wet etching can be used to pattern the conductive material 10. That way isolated gate contacts 10a can be created.

In this way, a III-V HEMT device can be obtained with a low gate resistance of lower than 100 Ω.mm can be obtained for a gate length of between 1 μm and 2 μm.

To further lower the gate resistance, according to embodiments of the invention, a T-shaped gate 22 can be formed by repeating the single damascene process as described above for forming gate contact 10a. Therefore a second dielectric layer 12 may be deposited. Holes or trenches 13 are etched in this second dielectric layer 12 (see FIG. 1(h)). These holes 13 can be filled with a conductive material 15. According to embodiments of the invention, a barrier layer 14 may be provided prior to the deposition of the conductive Material 15. The barrier layer 14 and conductive material 15 may comprise the same materials and have the same properties as described for barrier layer 9 and conductive material 10 used to form gate contact 10a as described above. Excess of conductive material 15 and material of the barrier layer 14 in between neighboring trenches 13 can be removed by CMP. Part 15a is also referred to as top plate of the gate contact 10a. Hence, the gate contact 10a together with the top plate 15a form a T-shaped gate contact 22 (see FIG. 1(i)). The conductive materials 10 and 15 may, according to embodiments of the invention, comprise a same material or can comprise different materials. If present, the barrier layers 9 and 14 may comprise different materials or may comprise a same material. In the above described process, the different process steps of a single damascene process are repeated.

Figure 1J:
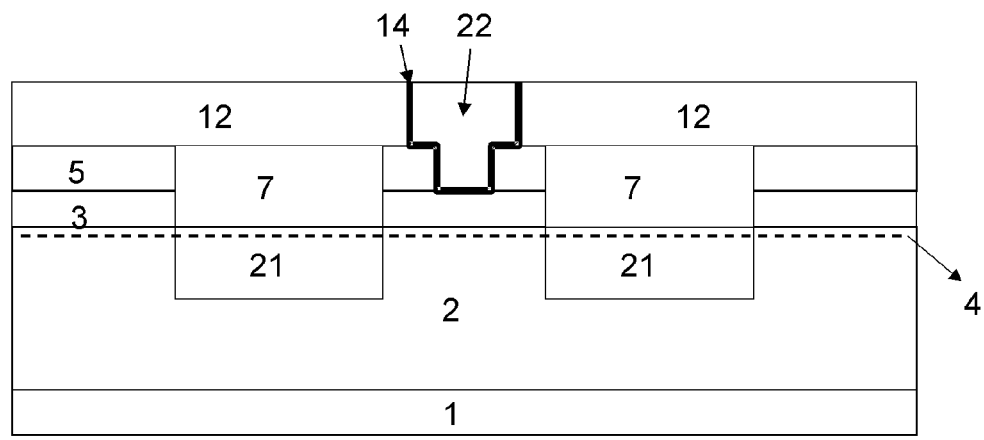
FIG. 1(j) illustrates a device having a T-gate formed by dual damascene processing according to embodiments of the present invention.

According to embodiments of the invention it is also possible to make the T-shaped gates 22 using dual-damascene technology, instead of repeating a single damascene process. This allows reducing the number of process steps and consequently reducing the processing cost. The resulting T-shaped gates 22 are represented in FIG. 1(j). In dual damascene processing the gate 10a and top plate 15a are made in one step instead of two steps. In case of a dual damascene process, etching the structures for the T-shaped gate 22 is done after depositing first passivation layer 5 and dielectric layer 12. Hence, in dual damascene processing, after forming source and drain contacts 7, passivating layer 5 and dielectric layer 12 are deposited. Passivation layer 5 and dielectric layer 12 can be made of one material or can be a combination of different insulating layers. The different layers can be introduced for different reasons, as etch stop layers or to facilitate lithography processes. Planarization of the deposited layers, for example for facilitating lithography processes, can done by CMP. This may then be followed by patterning holes for creating T-shaped gates 22. Therefore a first lithography process is followed by dry and/or wet etching and resist strip to create gate trenches 8. A second lithography process then defines the larger patterns for forming the top plate 15a of the gate contact. By using this process, a planarization process which was needed in the single damascene process after filling the first holes 6 in the passivation layer 5 can be avoided as these holes 6 are only filled after formation of the holes 13 in the dielectric layer 12. That way, T-shaped holes are formed. These holes can be filled with a conductive material. If needed prior to filling the holes with the conductive material, a barrier layer 14 can be deposited. Finally, the excess of conductive material in between the gate contacts can be removed by CMP.

The gate contact 22 may form a Schottky contact with the underlying HEMT structure. The materials can be optimized to achieve a good Schottky contact. This is not straightforward. First, the material properties of the materials should be chosen such that good Schottky contacts are realized. On the other hand, deposition of the conductive materials needs to be optimized to realize good filling of the trenches 8, 13, which may in turn change the material properties and may compromise the Schottky behavior of the contacts formed. So both the material properties and deposition method needs to be optimized to achieve reliable Schottky contacts with good filling of the trenches. Furthermore, suitable barrier layers used in trenches 8, 13 before deposition of conductive material are often not stoichiometric, therefore having a work function that is different from the stoichiometric composition, which also has to be taken into account. Hence, it is clear that the method according to embodiments of the invention requires careful consideration of what materials or combinations of materials have to be used to obtain good results, i.e. to obtain a HEMT device with good properties.

In the above described process sources and drain contacts 7 as well as the gate contact 22 are formed by damascene processing. However, alternatively source and drain contacts 7 can be formed by conventional techniques as illustrated in FIGS. 2 and 3. Similar steps as steps described with respect to FIG. 1 will not be repeated extensively. It has to be understood that the same techniques and materials as described in the above process may be used in the process according to the present embodiment.

Figure 2A:
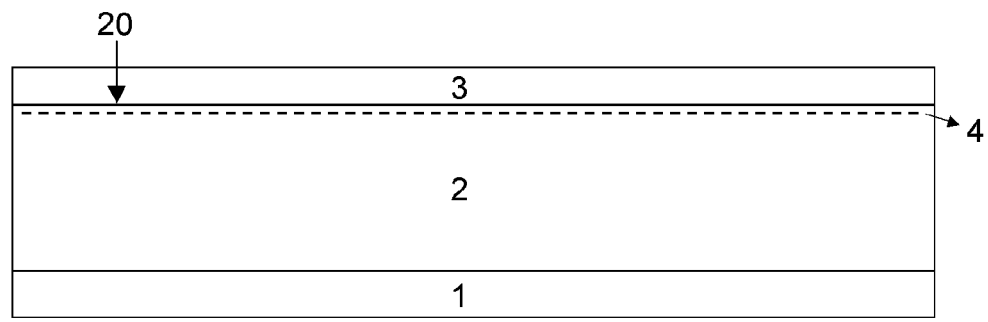
FIGS. 2(a) to 2(j) show subsequent processes for the formation of etched ohmic source and drain contacts and a damascene Schottky gate contact on an AlGaN—GaN HEMT device, including the fabrication of a T-gate using single damascene processing according to embodiments of the present invention.
Figure 2B:
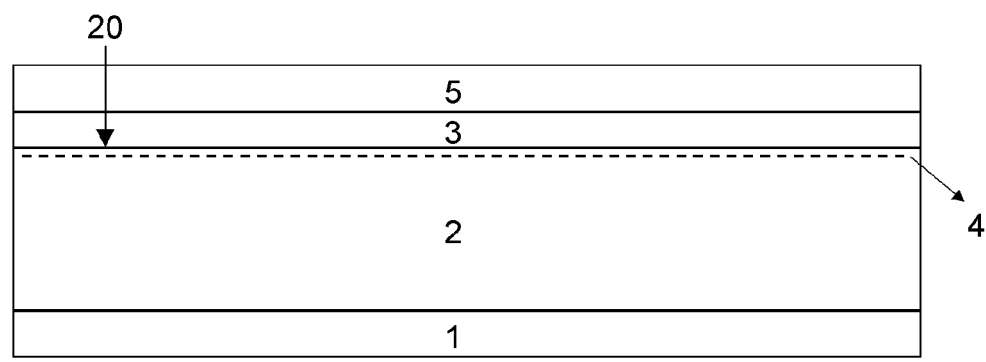

FIGS. 2(a) and 2(b) are similar to FIGS. 1(a) and 1(b) and show provision of different HEMT III-V layers on a substrate 1, e.g. Si(111) substrate, i.e. a first and second active layer 2, 3, a 2DEG 4 at the interface 20 between the first and second active layer 2, 3 and a first passivation layer 5, also referred to as first dielectric layer 5.

Figure 2C:
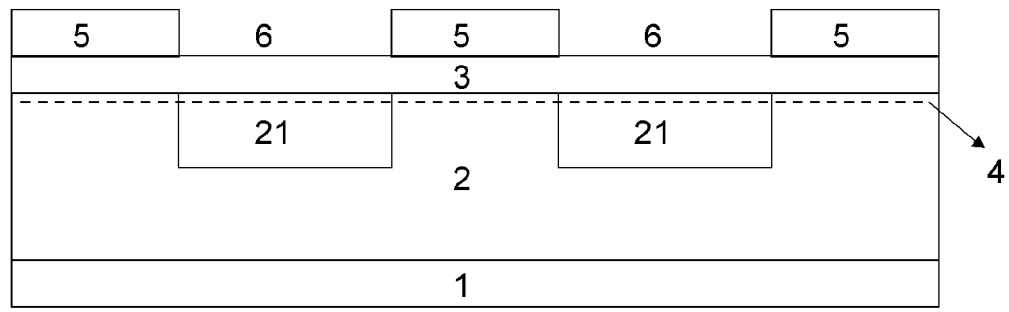
Figure 2D:
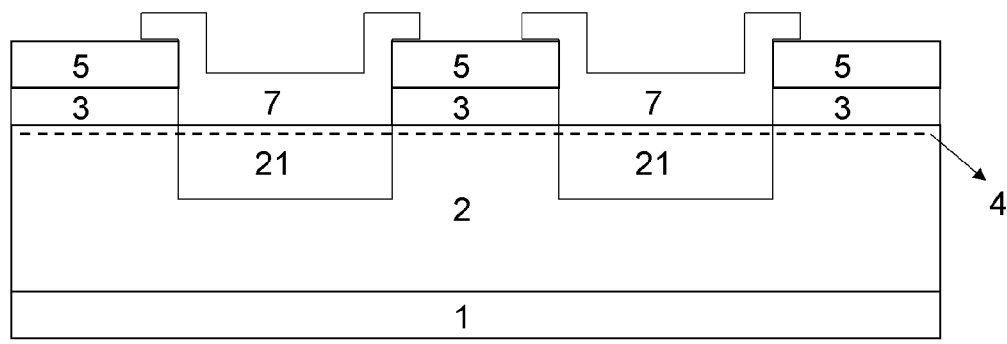

The formation of the ohmic source and drain contacts 7 is illustrated in FIGS. 2(c) and 2(d). To define the ohmic source drain regions 7 of the transistor, trenches 6 are defined in the passivation layer 5 by, for example, lithography and etching. Next, implantation of dopant elements, e.g. of Si, may be performed for forming doped regions 21 in the first active layer 2. Hereby, the patterned passivation layer 5 may act as a mask to protect regions outside these regions 21, as described above. Activation of the implanted elements may be done by a high temperature anneal process, e.g. at temperatures above about 600° C. This implantation may be optional, but may help to realize better ohmic source and drain contacts. Next, a conductive layer is deposited and patterned by lift-off or by dry (or wet) etching, stopping in the passivation layer. A high temperature anneal process, i.e. at temperatures between about 800° C. and 900° C., may be then be performed to form the ohmic source and drain contacts 7. During the anneal process a reaction can take place between the conductive material of the source and drain contacts 7 and the second active layer 2 to form good ohmic contacts.

Figure 2E:
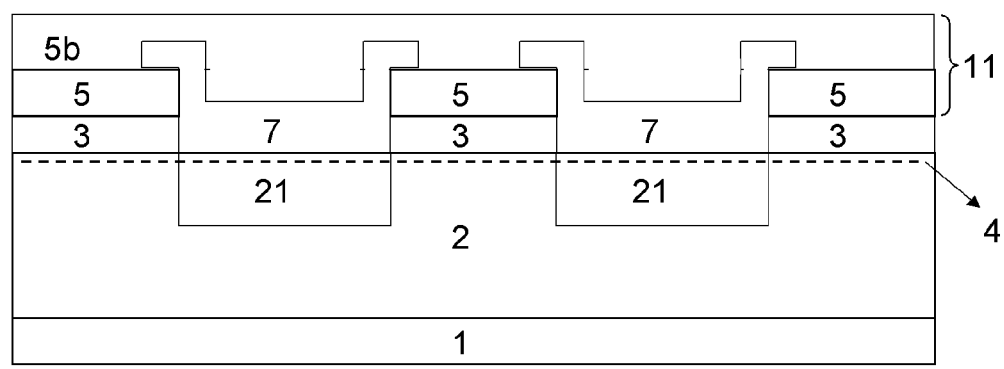
Figure 2F:
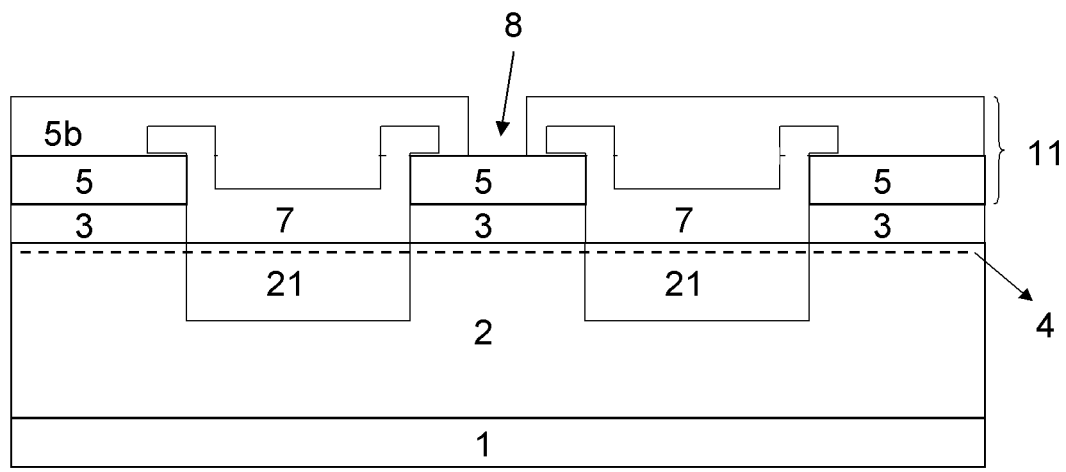

In a next process, a second passivation layer 5b may be deposited (see FIG. 2(e)) and planarized using CMP, etching back or by using spin-on-glass materials. The second passivation layer 5b may, for example, comprise a nitride or an oxide. The first and second passivation layer 5, 5b together may be referred to as dielectric stack 11. The first and second passivation layer 5, 5b may comprise a same material or may comprise different materials. According to embodiments of the invention, at least one of the first and second passivation layer 5, 5b may comprise a combination of different dielectric layers. In the gate dielectric stack 11, different layers can be introduced for lithography purposes, e.g. as etch stop layers, or low-k materials can be used to reduce capacitive coupling. Examples of dielectric or insulating materials that can be used to form the first and second passivation layer 5, 5b may be SiN, $SiO_2$, AlN, $Al_2O_3$, SiC, SiCN, SiOC, . . . . Examples of materials suitable to be used as etch stop layers may be SiN, SiC, . . . .

Gate trenches 8 may then be defined in the dielectric stack 11 by lithography and subsequent etching. Etching of the gate trenches 8 can stop in the gate dielectric stack 11 such that there is dielectric material remaining at the bottom of the gate trenches 8. In case of FIG. 2(f), the gate trenches 8 can be etched fully through the second passivation layer 5b down to the underlying first passivation layer 5, thereby stopping on the first passivation layer 5. This can be done when the first passivation layer 5 is thin, i.e. when the first passivation layer 5 has a thickness of between about 1 and 10 nm. The gate trenches 8 can also be etched fully through the second passivation layer 5b and partially in the first passivation layer 5, so stopping in the first passivation layer 5 before the second active layer 3 is reached. The gate trenches 8 can also be etched fully through the first and second passivation layers 5 and 5b, or in other words, fully through the dielectric stack 11, thereby stopping on the first active layer 2. The length of the gate to be formed may be between about 20 nm and 5 μm, particularly between about 50 nm and 2 μm.

Figure 2G:
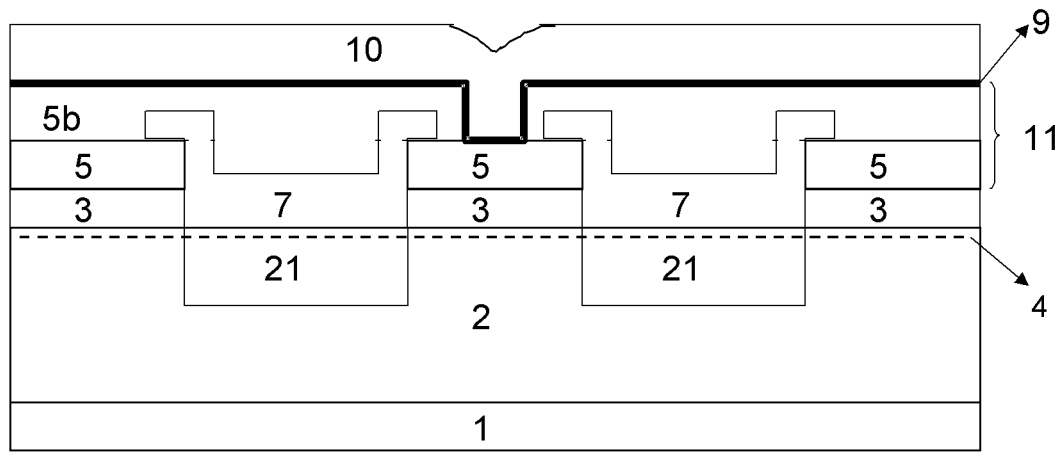
Figure 2H:
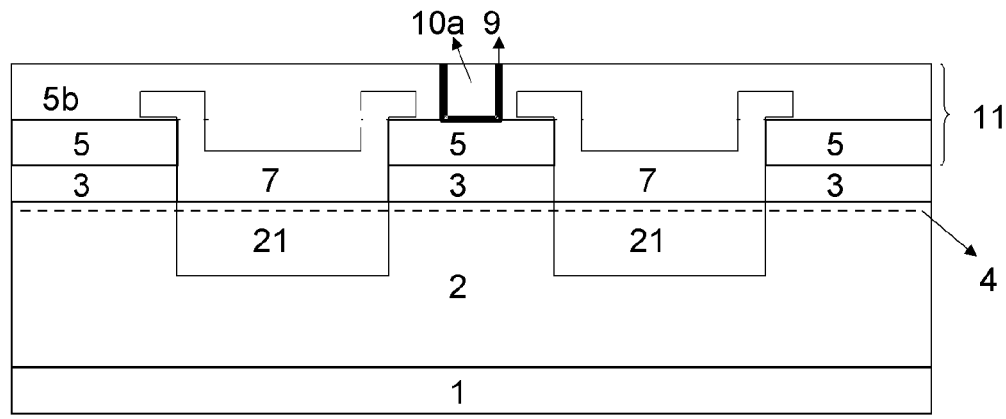
Figure 2I:
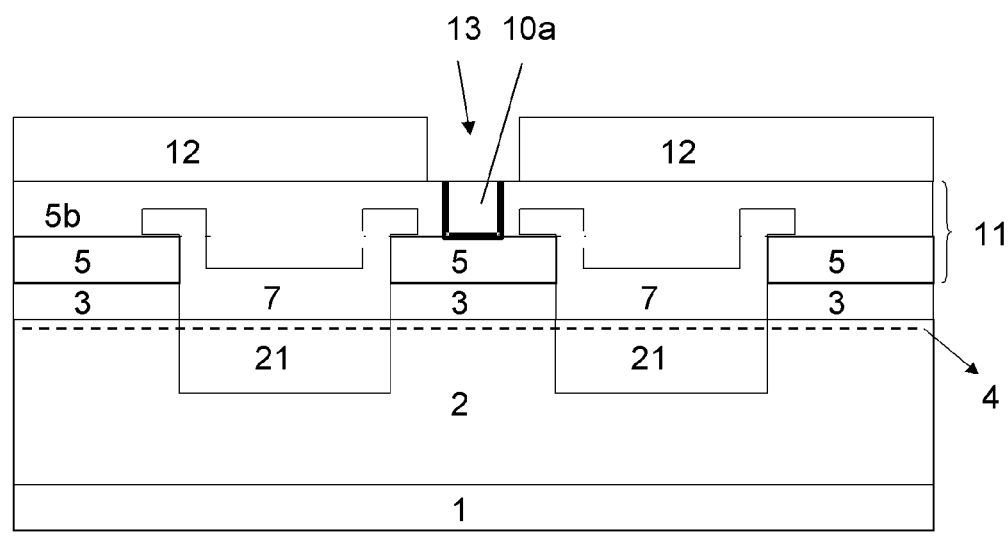
Figure 2J:
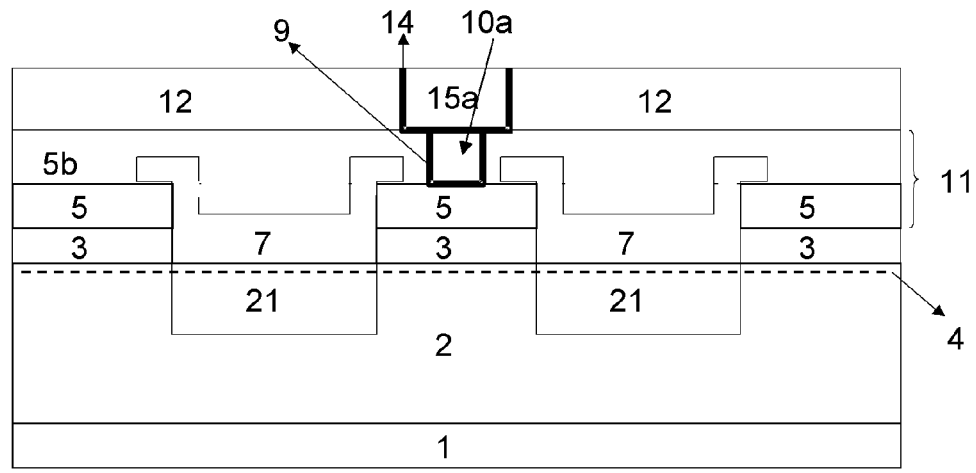

In a next process, a barrier layer 9 comprising e.g. Ta, TaN, Ti, TiN, WN, WNC, WSiN, Ru, Os, Mg, . . . or combinations thereof, may be deposited (see FIG. 2(g)). The barrier layer 9 may be deposited with a thickness of between about 5 nm and 50 nm, between about 10 nm and 40 nm, between about 20 and 30 nm. In case the barrier layer 9 consists of two different layers, the thickness of each layer can vary between about 2 nm and 48 nm, between about 3 nm and 40 nm, between about 5 nm and 20 nm or between about 10 nm and 15 nm. Then, a conductive material 10 is deposited. The conductive material 10 may be a low-resistivity metal such as e.g. Cu, Al, Au, Pt . . . . This may, for example, be done by electroplating. In cases where the conductive material 10 forms a Schottky barrier with no in-diffusion, sufficient adhesion and good reliability, the barrier layer 9 may be omitted. In cases where the conductive material 10 forms a Schottky barrier with no in-diffusion, sufficient adhesion and good reliability, the barrier layer 9 may be omitted. According to embodiments of the invention, in between the barrier layer 9 and the conductive material 10 a seed material, e.g. low-resistivity seed metal such as Cu, may be required. The excess conductive material 10 may then be removed by e.g. CMP (see FIG. 2(h)). Examples of combinations of a barrier layer 9 and a conductive material 10 suitable to be used according to embodiments of the invention may be a barrier layer 9 comprising Ti and/or TiN and a conductive material comprising Al, or a barrier layer 9 comprising Ta and/or TaN and a conductive material comprising Cu.

To lower the gate resistance, a T-shaped gate 22 can be formed by performing a second single damascene process. Therefore a second dielectric layer 12 may be deposited and patterned to define the top plate 15a of the T-shaped gate 22 to be formed (see FIG. 2(i)). Then, a barrier layer 14 may be deposited. On top of the barrier layer 14 a conductive material 15 may then be deposited and planarized. In that way, a T-shaped gate 22 is formed by using a repeated single damascene process (see FIG. 2(j)).

Figure 2K:
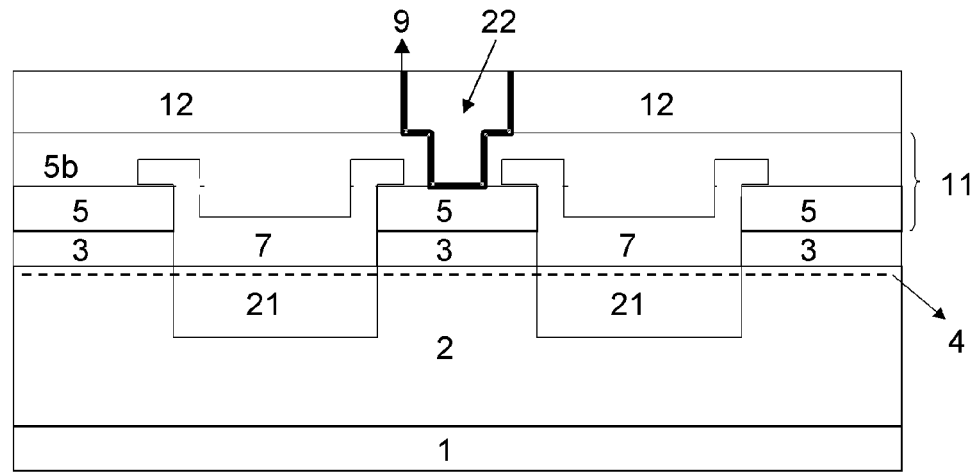
FIG. 2(k) illustrates a device having a T-gate formed by dual damascene processing according to embodiments of the present invention.

Again, according to embodiments of the invention and as described earlier, the T-shaped gate 22 may also be formed by dual damascene process. A device comprising a T-shaped gate 22 formed by dual damascene processing is illustrated in FIG. 2(k).

Figure 3A:
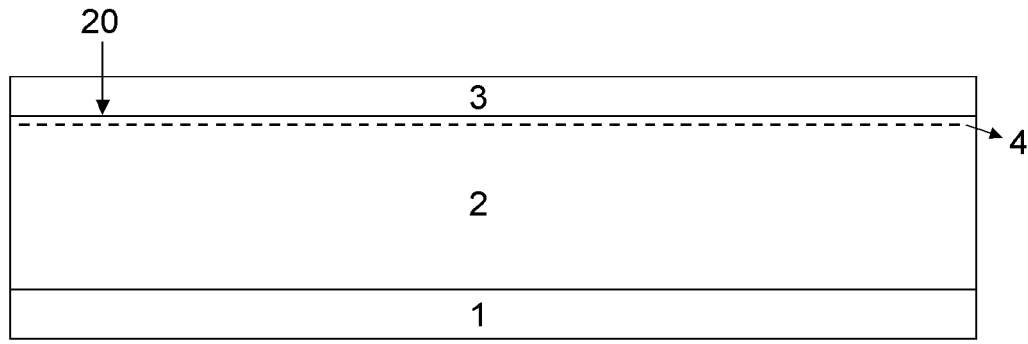
FIGS. 3(a) to 3(i) show subsequent processes for the formation of etched ohmic source and drain contacts and a damascene Schottky gate contact on an AlGaN—GaN HEMT device, including the fabrication of a T-gate using single damascene processing according to embodiments of the present invention.
Figure 3B:
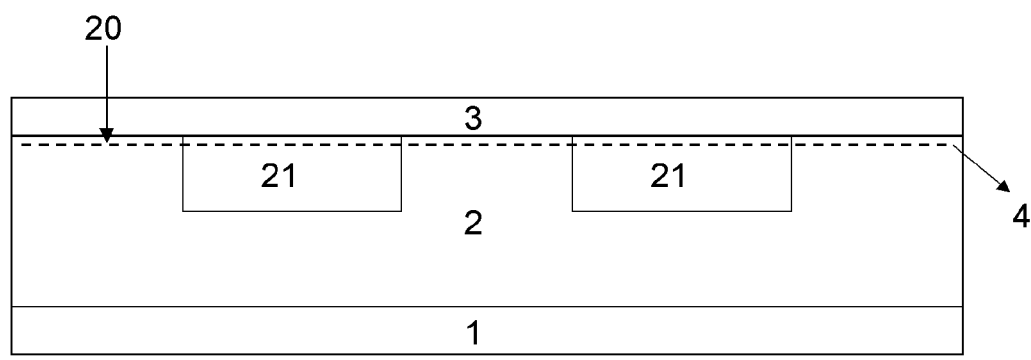
Figure 3C:
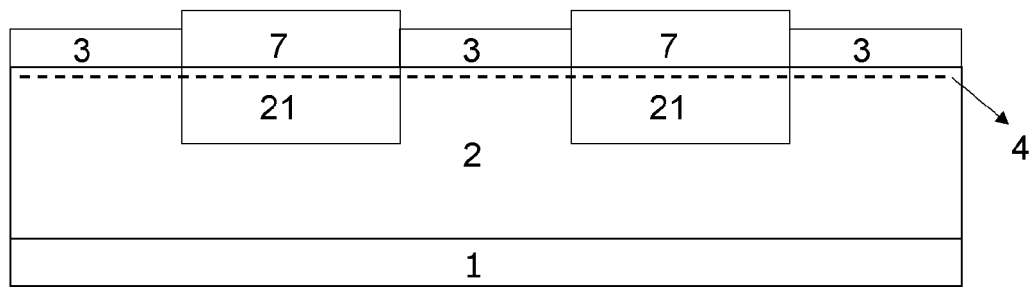
Figure 3D:
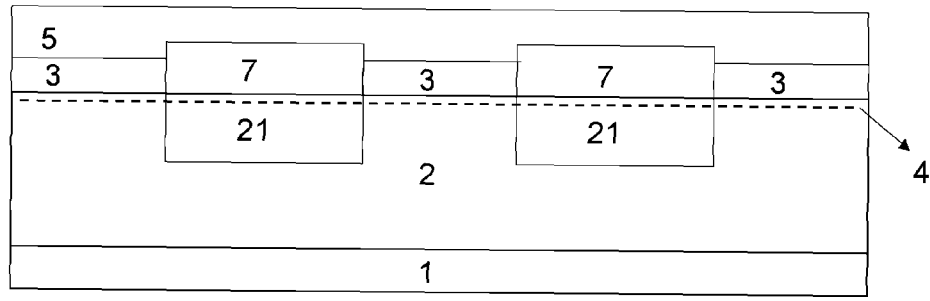

A further alternative for forming ohmic source and drain contacts 7 is described in a third embodiment and is illustrated in FIGS. 3(a) to 3(i). A first process illustrated in FIG. 3(a) is similar to the processes illustrated in FIGS. 1(a) and 2(a). A substrate 1 is provided with on top a first and second active layer 2, 3. A 2DEG 4 is then formed at the interface 20 between the first and second active layer 2, 3. According to this third embodiment, no passivation layer 5 is provided on top of the second active layer 3. Hence, source and drain contacts 7 may directly be formed onto the second active layer 3 (see FIGS. 3(b) and (c)). Implantation of dopant elements, for example of Si, may be performed to form doped regions 21 (see FIG. 3(b)), thereby using a mask formed of, for example, a patterned resist material. Activation of the implant may be done by a high temperature anneal process, i.e. at temperatures higher than about 600° C. This implantation may be optional, but may help to realize better ohmic source and drain contacts.

Then, a stack of conductive materials to form the source and drain regions 7 may be deposited and patterned by lift-off or by dry or wet etching, stopping in the second active layer or, if present, in the thin passivation layer. The stack of conductive materials may, for example, comprise Ti/Al, Ta/Ti/Al, Ti/Al/Mo/Au, . . . . A high temperature anneal process, i.e. at temperatures of between about 800° C. and 900° C., may be performed to form ohmic source and drain contacts 7. In that case, a reaction can take place between the conductive materials of the source and drain contacts 7 and the second active layer 3 and the source and drain contacts 7 thereby extend through the second active layer 3 onto the first active layer 2 (see FIG. 3(c)).

Figure 3E:
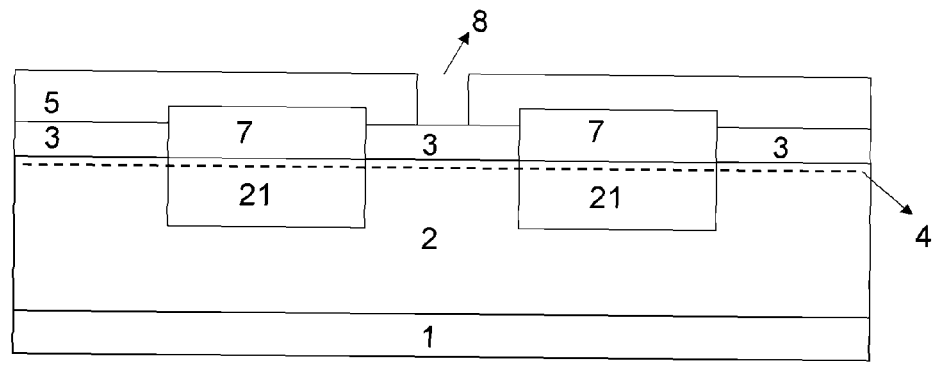
Figure 3F:
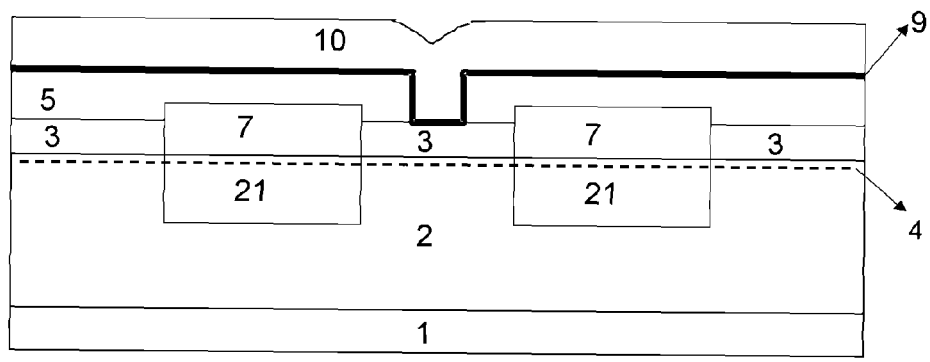
Figure 3G:
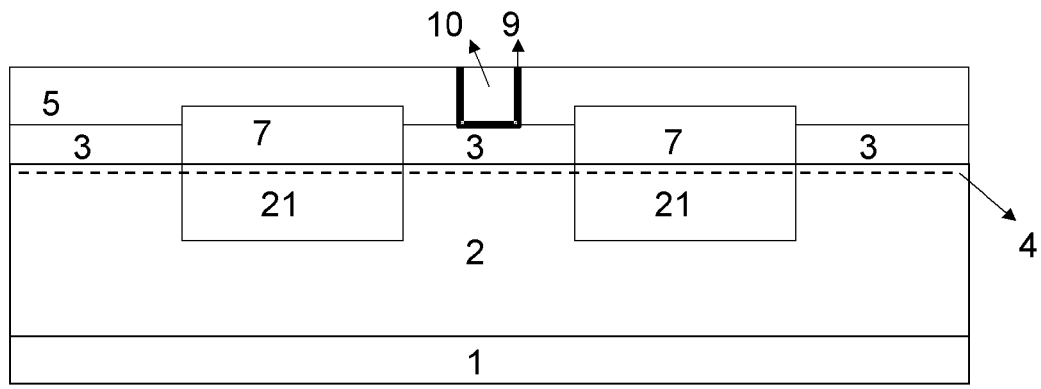
Figure 3H:
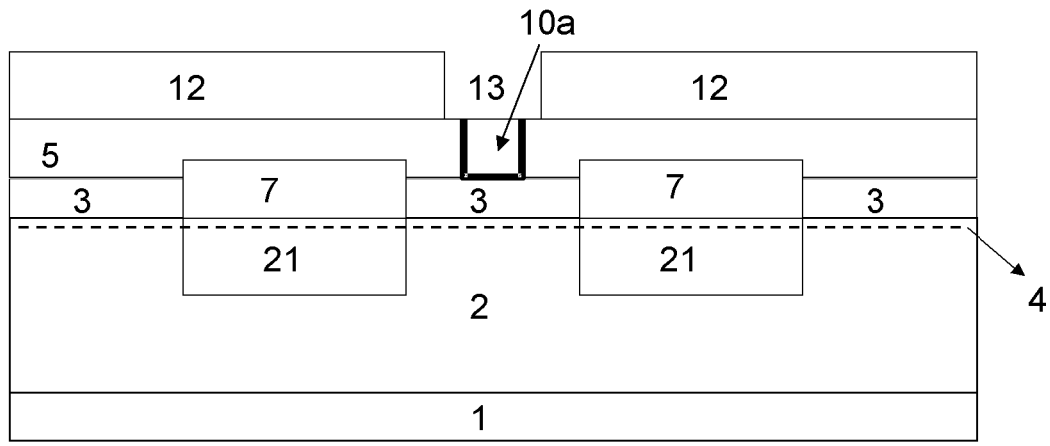
Figure 3I:
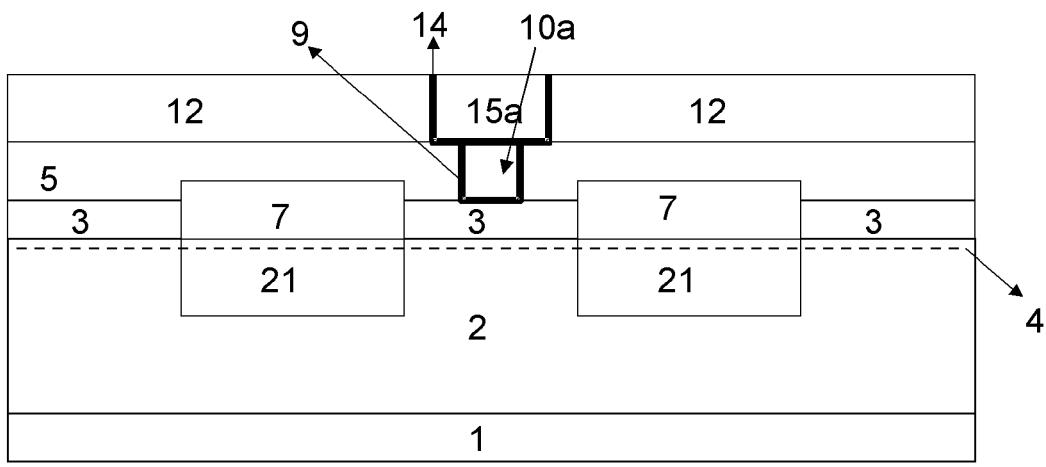

Formation of the gate contact 22 may then be performed similar as described for the first and second embodiment by using a repeated single damascene process. First, a passivation layer 5 which may be an oxide or a nitride may be deposited and planarized (see FIG. 3(d)). This passivation layer 5 may be patterned to form gate trenches 8 (see FIG. 3(e)). This may be done by, for example, etching. The length of the gate to be formed may be between about 20 nm and 5 particularly between about 50 nm and 2 µm. The gate trenches 8 may be etched fully through passivation layer 5, as is illustrated in FIG. 3(e), thereby stopping on the second active layer 3. According to other embodiments, the gate trenches 8 may only be etched partly through the passivation layer 5, such that at the bottom of the trench 8 there is still dielectric material of the passivation layer 5 present.

Then, a barrier layer 9 may be deposited. Examples of suitable materials to be used for the barrier layer 9 may be Ta, TaN, Ti, TiN, WN, WNC, WSiN, Ru, Os, Mg, . . . or combinations thereof. Often two different materials are used to form the barrier layer 9. Examples of suitable combination may be Ti/TiN, TaN/Ta, Ta/TaN, . . . . The thickness of the barrier layer 9 may be between about 5 nm and 50 nm, between about 10 nm and 40 nm, between about 20 and 30 nm. In case the barrier layer 9 includes or consists of two different layers, the thickness of each layer can vary between about 2 nm and 48 nm, between about 3 nm and 40 nm, between about 5 nm and 20 nm or between about 10 nm and 15 nm. Then, a conductive material 10 may be deposited (see FIG. 3(f)). The conductive material 10 may be a low-resistivity metal such as e.g. Cu, Al, Au, Pt, . . . . This may, for example, be done by electroplating. In cases where the conductive material 10 forms a Schottky barrier with no in-diffusion, sufficient adhesion and good reliability, the barrier layer 9 may be omitted. According to embodiments of the invention, in between the barrier layer 9 and the conductive material 10 a seed material, e.g. low-resistivity seed metal such as Cu, may be required. The excess conductive material 10 may then be removed by e.g. CMP (see FIG. 3(g)), thereby forming gate 10a. To lower the gate resistance, a T-shaped gate 22 can be formed by performing a second single damascene process. Therefore a second dielectric layer 12 may be deposited and patterned to define the top plate 15 of the T-shaped gate 22 to be formed (see FIG. 3(h)). Then, a barrier layer 14 may be deposited. On top of the barrier layer 14 a conductive material 15 may then be deposited and planarized. In that way, a T-shaped gate 22 is formed by using a repeated single damascene process (see FIG. 3(i)).

Figure 3J:
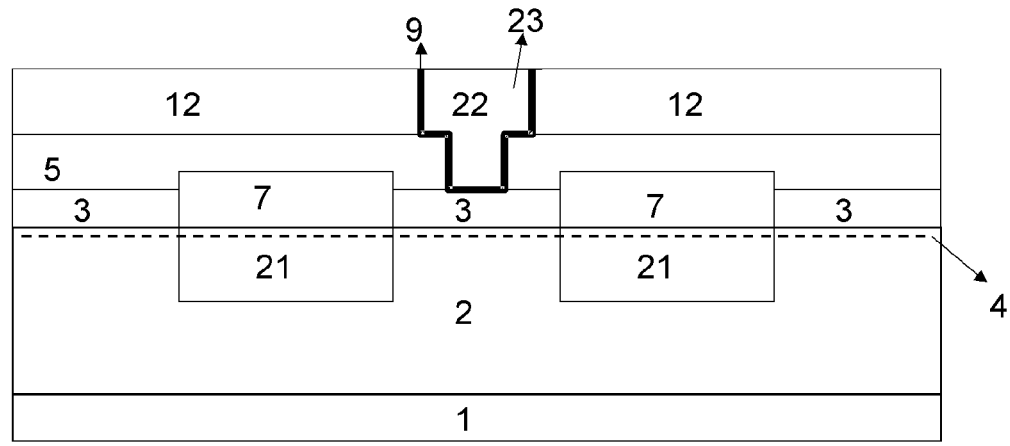
FIG. 3(j) illustrates a device having a T-gate formed by dual damascene processing according to embodiments of the present invention.

Again, according to embodiments of the invention and as described earlier, the T-shaped gate 22 may also be formed by dual damascene process. A device comprising a T-shaped gate 22 formed by dual damascene processing is illustrated in FIG. 3(j).

Hereinafter, some experiments will be described for explaining certain embodiments. It has to be understood that this is only for purpose of illustration and is not intended to limit the invention in any way.

Experiment: TaN/Cu Schottky Contact for the Gate

As indicated above, it is not straightforward that a Schottky contact is formed between the conductive material of the gate contact 10a and the underlying HEMT, in case the deposition of these materials is optimized for damascene technology, i.e. optimized for filling small holes or trenches with a width of between 20 nm and 100 nm.

In the experiment below, it was demonstrated that a Cu gate contact 10a with a TaN barrier layer 9 formed on top of an AlGaN/GaN HEMT structure forms a Schottky contact with a large barrier height meaning that this combination can be used to form a gate contact 10a by using the method according to embodiments of the invention. The workfunction of TaN is in the range of between 4.4 eV and 5 eV, depending on the stoichiometry of the compound.

Cu may be a suitable material to form the gate contact 10a due to its low resistivity of about $17.10^{-9}$ Ω.m at room temperature. TaN is used underneath Cu as a barrier layer 9 to limit diffusion of the Cu into underlying layers, i.e. the AlGaN/GaN HEMT structure in this case. In case of stoichiometric TaN, i.e. 50% Ta and 50% N, the Schottky barrier height may be stable up to 800° C. as was described by J. R. Hayes et al. in "Thermal stability of TaN Schottky contacts on n-GaN" in Acta Materialia 51, p. 653-663, 2003.

According to the present example, forming of the HEMT device was done as follows. An AlGaN/GaN heterostructure was grown on a 4 inch Si(111) substrate 1 with a highly resistive (resistivity of higher than $10^6$ Ω.cm) GaN buffer layer 2 to overcome the thermal expansion and lattice mismatch. This was performed by using a low-pressure metalorganic chemical vapor deposition (MOCVD) process. The thickness of the highly resistive GaN buffer layer 2 was about 1.3 µm. A 22 nm thick $Al_{0.3}Ga_{0.7}N$ layer 3 was then deposited on the GaN buffer 2. Trimethylgallium (TMG), trimethylaluminium (TMA) and ammonia ($NH_3$) were used as source materials for respectively Ga, Al and N. In-situ, a 3.5 nm thick nitride passivation layer 5 was deposited. The grown layer was smooth (rms roughness of ~0.2 nm) and crack-free. Good electrical characteristics were obtained. The sheet resistance was 250 Ω/square and the non-uniformity was less than 1.5% over the Si wafer.

Figure 4:
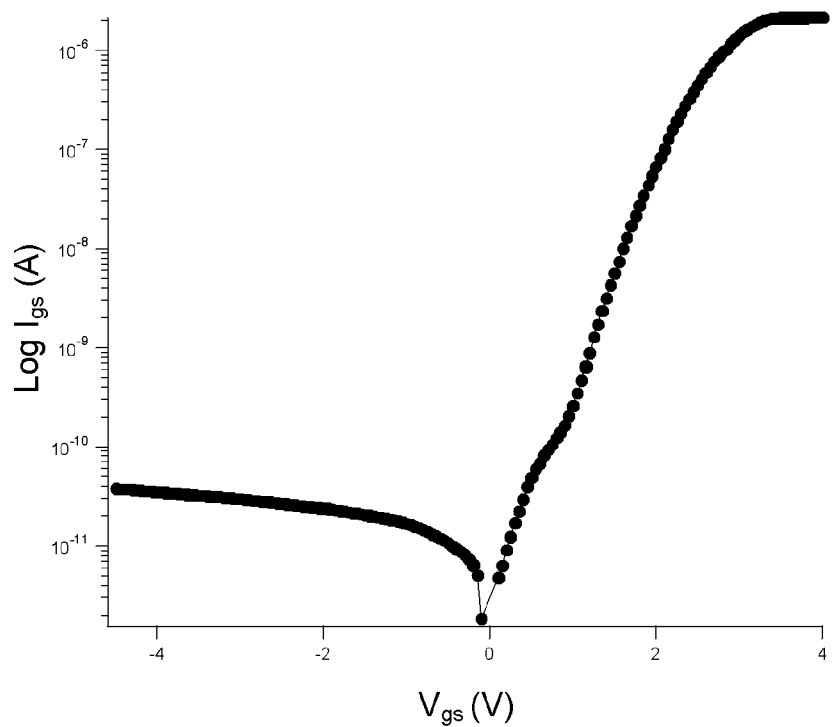
FIG. 4 shows forward and reverse current-voltage (I-V) characteristics for a TaN Cu diffusion barrier applied as a Schottky gate contact on an AlGaN/GaN-on-Si HEMT.

After the MOCVD process, the wafer was transferred to a standard 200 mm Si CMOS process line. On top of the grown heterostructure, TaN and Cu were deposited. Therefore an in-situ 3 min. degas at 350° C. was done, followed by a 60 sec. $H_2$/He reactive pre-clean, and finally 15 nm IMP (Ionized Metal Plasma) TaN and 100 nm electroplated Cu were deposited. Cu is used to lower the gate resistance. Gate patterning was done by wet etching. Good Schottky behavior characteristics were measured. This is illustrated in FIG. 4, where the forward and reverse I-V characteristic of TaN/Cu gate contacts 10a on an AlGaN/GaN-on-Si HEMT are shown.

Experiment: TaN/Cu Ohmic Contact for the Source and Drain

Figure 5:
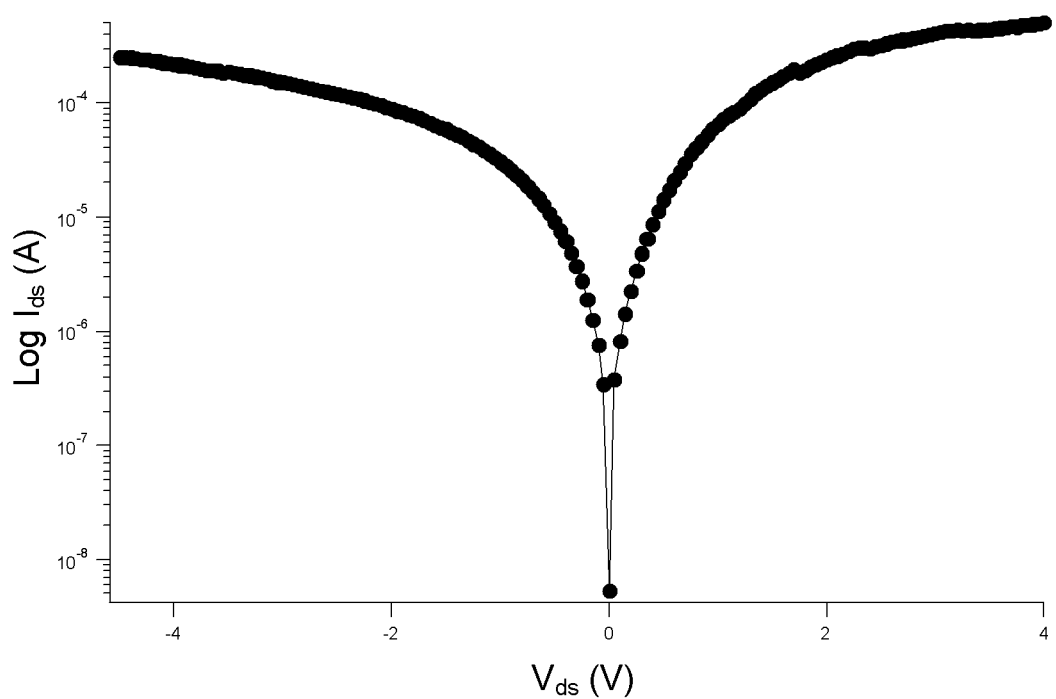
FIG. 5 shows forward and reverse current-voltage (I-V) characteristics of a TaN Cu diffusion barrier applied as ohmic source and drain contacts on an AlGaN/GaN-on-Si HEMT.

To illustrate the feasibility of furthermore forming TaN/Cu ohmic contacts on AlGaN/GaN HEMTs by using a damascene process, a similar experiment as the one described in the above experiment was performed. In this case non-stoichiometric but Ta-rich TaN was used with 80% of Ta and 20% of N for forming source and drain contacts 7. After an annealing process at 500° C. for 60 sec. in a nitrogen ambient an ohmic behavior of the contacts 7 was observed as illustrated in FIG. 5.

Experiment: CMOS Process Flow using 2 Times Single Damascene Processing

An AlGaN/GaN heterostructure is grown on an 8 inch or 200 mm Si(111) substrate 1 with a GaN buffer layer 2 to overcome the thermal expansion and lattice mismatch, using a low-pressure metalorganic chemical vapor deposition (MOCVD) process. This was performed as described for the first experiment.

After the MOCVD process, the wafer is transferred to a standard 200 mm Si CMOS process line. On top of the heterostructure Ti/Al ohmic source and drain contacts 7 and TaN/Cu Schottky gate contacts 10a are created by using damascene technology.

First a dielectric stack comprising 50 nm SiC and 200 nm SiN is deposited on top of a 3.5 nm in-situ grown nitride. Afterwards, a lithography process is performed for defining the ohmic contacts 7. Etching of trenches 6 in the dielectric stack was done in a two-step process. A first step uses an $O_2/CHF_3/CF_4$ plasma and is followed by a second etch step in $Ar/O_2/C_4F_8$ with a high etch selectivity towards the 50 nm SiC layer. Subsequently, the SiC layer is opened in an $Ar/N_2/CHF_3/CF_4/O_2$ plasma, selective to the 3.5 nm thick in-situ grown nitride layer. The resist is stripped in an $CF_4/O_2$ plasma.

A 40 keV, $1E16$ cm$^{-2}$ Si implantation is done in the ohmic areas, masked by the patterned passivation layer outside the ohmic regions as described by D. Qiao et al, "Low resistance ohmic contacts on AlGaN/GaN structures and the advancing Al/Ti metallization" in Applied Physics Letters 74, p. 2652-2654, 1999. The implantation was activated at 1150° C. for 30 sec. in an $N_2$ ambient. In the trenches 6 a metal stack comprising 50 nm Ta, 50 nm Ti and 500 nm Al was deposited by PVD. Excess Ti and Al was removed by CMP in a slurry based on $Al_2O_3$ abrasive particles. To form ohmic contacts 7 annealing was subsequently done at 650° C. for 40 sec., 850° C. for 40 sec. and at 950° C. for 4 min. This way, low-contact-resistance ohmic contacts 7 are obtained.

Afterwards gate contacts 10a are formed with a gate length size ranging between 200 nm and 2 mm. Therefore, gate trenches 8 are etched using a two-step process. A first step uses an $O_2/CHF_3/CF_4$ plasma and is followed by a second etch step in $Ar/O_2/C_4F_8$ with a high etch selectivity towards the 50 nm SiC layer. Subsequently, the SiC layer is opened in an $Ar/N_2/CHF_3/CF_4/O_2$ plasma, selective to the 3.5 nm thick in-situ grown nitride layer. The resist is stripped in an $CF_4/O_2$ plasma. A TaN/Ta metal barrier layer 9 and a Cu seed layer were then deposited in the gate trenches 8 by PVD. The barrier layer 9 was deposited using the following steps. An in-situ 3 min. degas at 350° C., a 60 sec. $H_2$/He reactive pre-clean and a metal stack with 15/10 nm TaN/Ta IMP (Ionized Metal Plasma). Afterwards the gate trenches 8 were filled with 600 nm Cu using electroplating. The excess Cu and TaN were removed by a two-step CMP process. First the Cu is selectively removed with respect to TaN using a commercially available slurry (Hitachi C430-A18), followed by removal of the TaN using another commercially available slurry (Arch Cu10k). This way small Schottky barrier gate contacts 10a with a length of between 200 nm and 2 mm and low-resistivity of lower than 100 Ω.mm.

To lower the gate resistance even further, a T-shaped gate 22 can be created by repeating the above described steps for forming the gate, thereby making a larger Cu plate 15a on top of the small gate contacts 10a. Therefore a dielectric stack 12 comprising 50 nm SiCN and 200 nm oxide is deposited. The SiCN acts a dielectric diffusion barrier for Cu, improves the adhesion of the dielectric stack and acts as an etch stop layer for the second single damascene process. Lithography is then used to form trenches 13 which later form the plate 15a of the T-shaped gate 22. These trenches 13 may have a length between 1 μm and 3 μm depending on the gate length.

The trenches 13 for forming the plate 15a are etched in a two-step process. A first step uses an $O_2/CHF_3/CF_4$ plasma and is followed by a second etch step in $Ar/O_2/C_4F_8$ with a high etch selectivity towards the 50 nm SiCN layer. Subsequently, the SiCN layer is opened in an $Ar/N_2/CHF_3/CF_4/O_2$ plasma followed by a $CF_4/O_2$ dry strip. These trenches 13 are than filled with a TaN/Ta barrier layer 14 and Cu. First the barrier layer 14 is deposited, using the following steps. An in-situ 3 min. degas at 350° C., a 60 sec. Ar plasma pre-clean and a metal stack with 15/10 nm TaN/Ta IMP. Afterwards the gate trenches 13 are filled with 600 nm Cu using electroplating. The excess Cu and TaN was removed by a two-step CMP process. First the Cu was selectively removed with respect to TaN using a commercially available slurry (Hitachi C430-A18), followed by removal of the TaN in another commercially available slurry (Arch Cu10k). This way small and very low-resistive Schottky barrier gates are created The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of manufacturing contacts on a III-V CMOS device, the method comprising:
   providing a control contact using damascene processing, wherein the control contact forms a Schottky contact, the process of providing the control contact comprising:
      depositing a dielectric stack on a first active layer and a second active layer;
      providing at least one hole in the dielectric stack, and filling the at least one hole with a conductive material;
   wherein filling the at least one hole with a conductive material comprises depositing a barrier layer before depositing a layer of conductive material, the barrier layer being in direct contact with the second active layer; and wherein the barrier layer is for preventing diffusion of conductive material in underlying layers, for improving adhesion of the conductive material on the dielectric stack, and/or for improving filling of the at least one hole with a conductive material.

2. The method according to claim 1, further comprising providing a first and second main contact such that the first and second main contact form ohmic contacts.

3. The method according to claim 2, wherein the process of providing a first and second main contact is performed by using damascene processing.

4. The method according to claim 1, wherein the process of providing a control contact is performed such that the control contact has a T-shaped form.

5. The method according to claim 4, wherein the process of providing a T-shaped control contact is performed by using dual damascene processing.

6. The method according to claim 1, wherein the process of filling the at least one hole with a conductive material further comprises:
   depositing a layer of conductive material on the barrier layer, and
   removing excess conductive material outside the at least one hole.

7. The method according to claim 6, wherein the process of removing excess conductive material is performed by chemical mechanical polishing.

8. The method according to claim 1, wherein the barrier layer comprises one or more materials selected from the group of Ti and TiN and wherein the conductive material comprises Al.

9. The method according to claim 1, wherein the barrier layer comprises one or more materials selected from the group of Ta and TaN and wherein the conductive material comprises Cu.

10. The method according to claim 6, further comprising, before depositing a layer of conductive material, performing a cleaning process.

11. The method according to claim 10, wherein the cleaning process comprises:
   degassing at a temperature between 300° C. and 500° C., and
   cleaning the at least one hole with an Ar plasma or H2/N2 reactive pre-clean.

12. The method according to claim 1, further comprising, before providing at least one hole, planarizing the dielectric stack.

13. The method according to claim 12, wherein the process of planarizing the dielectric stack is performed by chemical mechanical polishing.

14. The method according to claim 1, wherein the dielectric stack comprises at least one material selected from the group of SiN, $SiO_2$, and SiC.

15. A method of manufacturing a high electron mobility transistor wherein the control contact forms a gate contact, the method comprising manufacturing contacts on a group III-V CMOS device according to claim 1.

16. A CMOS device comprising contacts as manufactured by the method according to claim 1.

17. A high electron mobility transistor comprising contacts as manufactured by the method according to claim 1.

18. A method of manufacturing a III-V CMOS device, the method comprising:
   providing a gate contact, the gate contact being formed as a Schottky contact, wherein the process of providing a gate contact comprises:
   depositing a dielectric stack;
   forming at least one hole in the dielectric stack;
   filling the at least one hole with a conductive material, wherein filling the at least one hole with a conductive material comprises depositing a barrier layer before depositing a layer of conductive material, the barrier layer being in direct contact with an active layer and wherein the barrier layer is for preventing diffusion of conductive material in underlying layers, for improving adhesion of the conductive material on the dielectric stack, and/or for improving filling of the at least one hole with a conductive material; and
   removing excess conductive material outside the at least one hole by chemical mechanical polishing.

19. The method according to claim 1, wherein the method further comprises providing the control contact on a first active layer and a second active layer, wherein the second active layer has a higher band gap than the first active layer.

* * * * *